(12) United States Patent
Nakajima et al.

(10) Patent No.: US 9,963,622 B2
(45) Date of Patent: *May 8, 2018

(54) HEAT-RESISTANT ADHESIVE SHEET FOR SEMICONDUCTOR TESTING

(71) Applicant: DENKA COMPANY LIMITED, Tokyo (JP)

(72) Inventors: Gosuke Nakajima, Shibukawa (JP); Tomoya Tsukui, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/895,546

(22) PCT Filed: Jun. 10, 2014

(86) PCT No.: PCT/JP2014/065370
§ 371 (c)(1),
(2) Date: Dec. 3, 2015

(87) PCT Pub. No.: WO2014/199993
PCT Pub. Date: Dec. 18, 2014

(65) Prior Publication Data
US 2016/0130481 A1 May 12, 2016

(30) Foreign Application Priority Data

Jun. 14, 2013 (JP) .................................. 2013-125315

(51) Int. Cl.
| | | |
|---|---|---|
| C08F 220/20 | (2006.01) | |
| H01L 21/68 | (2006.01) | |
| C09J 133/08 | (2006.01) | |
| C08F 2/48 | (2006.01) | |
| C09J 4/06 | (2006.01) | |
| C09J 133/06 | (2006.01) | |
| C09J 175/04 | (2006.01) | |
| C09J 183/10 | (2006.01) | |
| H01L 21/683 | (2006.01) | |
| C08G 18/62 | (2006.01) | |
| C08G 18/67 | (2006.01) | |
| C08G 18/73 | (2006.01) | |
| C08G 18/79 | (2006.01) | |
| C08G 18/80 | (2006.01) | |
| C09J 175/16 | (2006.01) | |
| C09J 133/14 | (2006.01) | |
| C08L 75/14 | (2006.01) | |
| C08L 83/00 | (2006.01) | |

(52) U.S. Cl.
CPC .............. *C09J 133/08* (2013.01); *C08F 2/48* (2013.01); *C08G 18/6229* (2013.01); *C08G 18/673* (2013.01); *C08G 18/73* (2013.01); *C08G 18/792* (2013.01); *C08G 18/8022* (2013.01); *C08L 75/14* (2013.01); *C08L 83/00* (2013.01); *C09J 4/06* (2013.01); *C09J 7/35* (2018.01); *C09J 133/06* (2013.01); *C09J 133/14* (2013.01); *C09J 175/04* (2013.01); *C09J 175/16* (2013.01); *C09J 183/10* (2013.01); *H01L 21/6836* (2013.01); *C09J 2203/326* (2013.01); *C09J 2433/00* (2013.01); *H01L 2221/68327* (2013.01)

(58) Field of Classification Search
CPC . C09J 133/08; C09J 133/06; C09J 4/06; C09J 175/04; C09J 183/10; C09J 2203/326; C09J 2433/00; C08F 2/48; C08F 2/52; C08G 18/8022; C08G 175/16; C08G 18/6229; C08G 18/673; C08G 18/73; C08G 18/792; H01L 21/6836; H01L 2221/68327

See application file for complete search history.

(56) References Cited

FOREIGN PATENT DOCUMENTS

| | | |
|---|---|---|
| JP | 2004-031463 A | 1/2004 |
| JP | 2005-298579 A | 10/2005 |
| JP | 2009-245989 A | 10/2009 |
| JP | 2012-248640 A | 12/2012 |

(Continued)

OTHER PUBLICATIONS

Neopulim L—Transparent Polyimide Film. Product Sheet from Mitsubishi Gas Chemical Co., Inc. Retrieved online. Retrieved on [Feb. 6, 2017]. Retrieved from internet <URL://http://www.readbag.com/mgc-jp-eng-products-nop-pdf-neopulim>.*
DuPont Kapton: Summary of properties from Dupont. [online]. [Retrieved on Sep. 22, 2017]. Retrieved from <URL://http://www.dupont.com/content/dam/dupont/products-and-services/membranes-and-films/polyimde-films/documents/DEC-Kapton-summary-of-properties.pdf.> pp. 1-20 (Year: 2017).*
Sep. 9, 2014 International Search Report issued in International Patent Application No. PCT/JP2014/065370.

(Continued)

*Primary Examiner* — Sanza McClendon
(74) *Attorney, Agent, or Firm* — Oliff PLC

(57) ABSTRACT

A heat-resistant adhesive sheet for semiconductor testing, used in a performance test while semiconductor chips are heated includes: a base material; and an adhesive layer provided on the base material, the base material having a thermal shrinkage of lower than 1% when being heated at 150 degrees Celsius for 30 minutes and a linear expansion coefficient of equal to or lower than $5.0\times10^{-5}$ at 60 to 150 degrees Celsius, and the adhesive layer containing a (meth) acrylic acid ester copolymer, a photopolymerizable compound, a polyfunctional isocyanate curing agent, and photoinitiator. The adhesive layer contains 5 to 200 parts by mass of the photopolymerizable compound, 0.5 to 20 parts by mass of the polyfunctional isocyanate curing agent, and 0.1 to 20 parts by mass of the photoinitiator, with respect to 100 parts by mass of the(meth)acrylic acid ester copolymer. The adhesive layer is free of tackifying resin.

8 Claims, No Drawings

(56) References Cited

FOREIGN PATENT DOCUMENTS

JP   WO2012/165368 A1   12/2012
WO  WO20120165368 A  *  12/2012

OTHER PUBLICATIONS

Apr. 10, 2017 Chinese Office Action Issued in Chinese Patent Application No. 201480031649.8.
Jul. 13, 2017 Office Action issued in Taiwanese Patent Application No. 103120249.
Dec. 4, 2017 Office Action issued in Chinese Patent Application No. 201480031649.8.

* cited by examiner

HEAT-RESISTANT ADHESIVE SHEET FOR SEMICONDUCTOR TESTING

TECHNICAL FIELD

The present invention relates to a heat-resistant adhesive sheet for semiconductor testing.

BACKGROUND ART

A semiconductor chip can be produced in the following manner. First, a circuit pattern is formed on a semiconductor wafer and an adhesive sheet is bonded to the semiconductor wafer, and then, the semiconductor wafer undergoes the following steps: cutting the wafer into chips (dicing step); washing and drying the sheet; expanding the sheet (expansion step); peeling the chips off from the sheet (pick-up step); and mounting the chips. It is required that the adhesive sheet such as a dicing tape used in those steps has a sufficient adhesive force to adhere the diced chips from the dicing step to the drying step, while reducing such adhesive force in the pick-up step to such an extent that adhesive deposit does not occur.

There has been known an adhesive sheet formed by applying an adhesive layer which will be cured by polymerization with ultraviolet light and so forth, to a base material having a transmittivity when being passed through by an active light such as UV light and/or an electron beam. With this adhesive sheet, the diced chips are picked up after the adhesive strength is reduced by irradiating the adhesive layer with the UV light and curing the adhesive layer with polymerization.

There has been disclosed an adhesive sheet formed by coating the base material surface with an adhesive layer containing a compound (polyfunctional oligomer) having a photopolymerizable unsaturated double bond in its molecule, which maybe turned into a three-dimensional network by irradiation with, for example, an active light. This has been disclosed in Patent Literatures 1 and 2.

CITATION LIST

Patent Literature

PTL1: Japanese Patent Application Laid-Open No. 2009-245989
PTL2: Japanese Patent Application Laid-Open No. 2012-248640

SUMMARY OF INVENTION

Technical Problem to be Solved by the Invention

In manufacturing a semiconductor, various processing and performance testing are performed in the following steps:
Dicing of a semiconductor wafer;
Performance testing at normal temperature;
Packaging; and
Performance testing at both high temperature and normal temperature.

In the above-described process, it is not possible to find a chip which is defective under a high temperature until the performance testing after the packaging. Therefore, all the chips including those which are defective under a high temperature have to be packaged, resulting in an increased manufacturing cost.

If the performance test after dicing could be performed at high temperature, the packaging cost would be reduced. However, this performance testing is performed under the condition that the semiconductor chips are bonded to an adhesive sheet such as a dicing tape, and therefore if the semiconductor chips are heated, the adhesive sheet is deformed or is excessively stick fast to the chips.

When the adhesive sheet is deformed, it is not possible to automatically align electrode pads formed on the wafer with a test probe, and therefore it takes a long time for the testing. Moreover, if the adhesive sheet is significantly deformed, the wafer is likely to contact the test probe, and therefore the test may not be performed. In addition, if the distance between the semiconductor chips is narrow, the chips contact each other, and therefore the chips are likely to be damaged or the strength of the chips may be reduced.

Moreover, when the adhesive sheet is excessively stick fast to the semiconductor chips, the adhesive strength of the adhesive layer is not sufficiently reduced even though the adhesive layer is cured by irradiation with UV light and so forth. This makes it difficult to pick up the chips or leads to a failure such as adhesive deposit.

Solution to Problem

The inventers of the present invention found that the deformation of the adhesive sheet due to heating was caused by the thermal shrinkage and the linear expansion coefficient of the base material, and that the reason why the adhesive layer was softened by the heating was softening of tackifying resin contained in the adhesive.

Based on these findings, the present invention provides an adhesive sheet using a base material having a low thermal shrinkage and a low linear expansion coefficient.

According to the present invention, the heat-resistant adhesive sheet for semiconductor testing, used in a performance test while semiconductor chips are heated, includes a base material, and an adhesive layer provided on the base material. The base material has a thermal shrinkage of lower than 1% when being heated at 150 degrees Celsius for 30 minutes and a linear expansion coefficient of equal to or lower than $5.0 \times 10^{-5}$ at 60 to 150 degrees Celsius. The adhesive layer contains a (meth)acrylic acid ester copolymer, a photopolymerizable compound, a polyfunctional isocyanate curing agent, and photoinitiator. The adhesive layer contains 5 to 200 parts by mass of the photopolymerizable compound, 0.5 to 20 parts by mass of the polyfunctional isocyanate curing agent, and 0.1 to 20 parts by mass of the photoinitiator, with respect to 100 parts by mass of the(meth) acrylic acid ester copolymer. The adhesive layer is free of tackifying resin.

Preferably, the adhesive layer contains a silicone-based graft copolymer. In addition, it is preferred that the polyfunctional isocyanate curing agent contains three or more isocyanate groups. Moreover, it is preferred that when the temperature of the photoinitiator is increased from 23 degrees Celsius at a rate of temperature increase of 10 degrees Celsius/min, the temperature, at which the mass reduction rate of the photoinitiator is 10%, is equal to or higher than 250 degree Celsius. Furthermore, it is preferred that the heat-resistant adhesive sheet is used in a method of manufacturing a semiconductor. The method includes: (a) a bonding step of bonding the adhesive sheet to the semiconductor chips; (b) a sticking fast step of sticking the semiconductor chips to which the adhesive sheet is bonded fast to a stage having a temperature of 60 to 150 degrees Celsius while the adhesive sheet contacts the stage; (c) a test step of testing performance of the semiconductor chips while the stage is heated at 60 to 150 degrees Celsius; (d) a UV irradiation step of irradiating the adhesive sheet with ultraviolet light; and (e) a pick-up step of picking up the semiconductor chips from the adhesive sheet. Furthermore, it is preferred that the heat-resistant adhesive sheet is used in a method of manufacturing a semiconductor. The method includes: (a) a bonding step of bonding the adhesive sheet to a semiconductor wafer or a substrate; (b) a dicing step of dicing the semiconductor wafer or the substrate into semiconductor chips; (c) a sticking fast step of sticking the semiconductor chips to which the adhesive sheet is bonded fast to a stage having a temperature of 60 to 150 degrees Celsius while the adhesive sheet contacts the stage; (d) a test step of testing performance of the semiconductor chips while the stage is heated at 60 to 150 degrees Celsius, (e) a UV irradiation step of irradiating the adhesive sheet with ultraviolet light; and (f) a pick-up step of picking up the semiconductor chips from the adhesive sheet.

Moreover, the present invention provides a method of manufacturing electronic components, including a step of heating the electronic components to which an adhesive sheet is bonded at 60 to 150 degrees Celsius. The adhesive sheet is formed by laminating a light curing adhesive layer on a base material having a low thermal shrinkage and a low linear expansion coefficient. The light curing adhesive contains a (meth)acrylic acid ester copolymer, a photopolymerizable compound, a polyfunctional isocyanate curing agent, and photoinitiator, and is free of tackifying resin.

Here, "tackifying resin" has been conventionally used to improve the adhesiveness of the acrylic adhesive, and includes, for example, rosin resin, terpene resin, aliphatic petroleum resin, aromatic petroleum resin, hydrogenerated petroleum resin, coumarone-indene resin, styrene resin, xylene resin, and a mixture thereof.

Effect of the Invention

According to the present invention, it is possible to provide an adhesive sheet that is resistant to heating so that the adhesive sheet is not likely to be deformed and the adhesive layer is not likely to be softened. As a result, it is possible to test a heated semiconductor wafer. Conventionally, a wafer is tested in a heated state after the packaging step of semiconductor manufacturing. However, the present invention allows the wafer to be tested in the heated state before the packaging step. That is, in the present invention, it is possible to determine whether a chip is defective in the heated state before the packaging step, and therefore to prevent the defective chip from being packaged. As a result, it is possible to reduce the packaging cost.

DESCRIPTION OF EMBODIMENTS

Hereinafter, a preferred embodiment of the present invention will be described. Here, the embodiment described later is only one example of the embodiments of the present invention, and does not limit the scope of the invention.
1. Adhesive Sheet
(1) Base material
(2)Light curing adhesive
(2-1) Free of tackifying resin
(2-2) (Meth)acrylic acid ester copolymer
(2-3) Photopolymerizable compound
(2-4) Polyfunctional isocyanate curing agent
(2-5) Photoinitiator 2. Method of Manufacturing Electronic Components
(1) Bonding step
(2) Heating step
(3) Dicing step
(4) UV irradiation step
(5) Pick-up step
1. Adhesive Sheet The adhesive sheet according to the present invention is formed by laminating a light curing adhesive layer (hereinafter referred to as "adhesive layer") on a base material having a low thermal shrinkage and a low linear expansion coefficient, and the adhesive layer is free of tackifying resin. The adhesive sheet according to the present invention is not deformed when it is heated. In addition, the adhesive sheet according to the present invention is not excessively stick fast to the semiconductor wafer because the adhesive layer is not softened due to the softening of the tackifying resin. Therefore, the adhesive sheet according to the present invention can prevent a testing time from being lengthened and semiconductor chips from being damaged, which are otherwise caused due to the deformation of the adhesive sheet. Moreover, it is possible to sufficiently reduce the adhesive strength by the irradiation with UV light and so forth, and therefore to prevent pick-up failure and adhesive deposit.

(1) Base Material

It is preferred that the thermal shrinkage of the base material is equal to or less than 1% when the base material is heated at 150 degrees Celsius for 30 minutes. If the thermal shrinkage is greater than 1%, the base material shrinks in the heated state, and therefore the adhesive sheet may be deformed. Here, the thermal shrinkage is calculated by the following equation.

$$(L0-L1)/L0 \times 100 \ (\%)$$

where, L0 represents the length of the base material before heating (10 cm); and L1 represents the length of the base material after the base material is heated at 150 degrees Celsius for 30 minutes and cooled down to the room temperature. In addition, it is preferred that the linear expansion coefficient of the base material is equal to or less than $5.0 \times 10^{-5}$/K. If the linear expansion coefficient of the base material is greater than $5.0 \times 10^{-5}$/K, the difference in the linear expansion coefficient is increased between the base material and the ring frame to which the adhesive sheet is bonded or the semiconductor wafer and chips which are to be tested, and consequently the adhesive sheet may be deformed. The base material may be made of plastic such as polyethylenenaphthalate (PEN), polyphenylene sulfide (PPS), polyetheretherketone (PEEK), polyamide-imide (PAI), polyimide (PI) or paper such as Japanese paper, premium grade paper, glassine, and crepe paper. Moreover, the paper base material may be impregnated or filled with latex.

The base material may be a single-layer film/sheet or a multilayer film/sheet made of the above-described materials, or a multilayer film formed by laminating films made of various materials. The thickness of the base material is 50 to 200 μm, preferably 70 to 150 μm.

It is preferred that antistatic treatment is applied to the base material. The antistatic treatment may include blending an antistatic agent into the base material, applying the antistatic agent to the base material surface, and using a corona discharge.

For example, a quaternary amine salt monomer may be used as the antistatic agent. Examples of the quaternary amine salt monomer may include a dimethylaminoethyl (meth)acrylate quaternary chloride, a diethylaminoethyl (meth)acrylate quaternary chloride, a methylethylaminoethyl (meth)acrylate quaternary chloride, a p-dimethylaminostyrene quaternary chloride, and a p-diethylaminostyrene quaternary chloride. Particularly, the dimethylaminoethyl (meth)acrylate quaternary chloride is preferred.

(2) Light Curing Adhesive

The light curing adhesive forming the adhesive layer of the adhesive sheet according to the present invention contains a (meth)acrylic acid ester copolymer, a photopolymerizable compound, a polyfunctional isocyanate curing agent, and photoinitiator, and is free of tackifying resin.

(2-1) Free of Tackifying Resin

Examples of the tackifying resin which causes the adhesive layer to be softened due to heating may include rosin resin, terpene resin, aliphatic petroleum resin, aromatic petroleum resin, hydrogenated petroleum resin, coumarone-indene resin, styrene resin, xylene resin, and a mixture thereof.

Various additives, such as a peeling agent, an age resistor, a filler, an ultraviolet absorber, and a light stabilizer, may be added to the adhesive as long as they are free of tackifying resin. The peeling agent may include, for example, a silicone-based graft polymer (the silicone polymer shown in Table 1). Here, the tackifying resin is not used in Examples but used in Comparative examples of the present invention.

(2-2) (Meth)acrylic Acid Ester Copolymer

The (meth)acrylic acid ester copolymer may be a polymer consisting of a (meth)acrylic acid ester monomer, or a copolymer consisting of a (meth)acrylic acid ester monomer and a vinyl compound monomer. Here, acrylate and methacrylate are collectively referred to as "(meth)acrylate." Likewise, compounds with and without "meth" are correctively referred to as compound with "meth" such as (meth) acrylic acid.

Examples of the (meth)acrylic acid ester monomer may include 2-butyl(meth)acrylate, t-butyl(meth)acrylate, pentyl (meth)acrylate, octyl(meth)acrylate, 2-ethylhexyl(meth) acrylate, nonyl(meth)acrylate, decyl(meth)acrylate, lauryl (meth)acrylate, methyl(meth)acrylate, ethyl(meth)acrylate, isopropyl(meth)acrylate, tridecyl(meth)acrylate, myristyl (meth)acrylate, cetyl(meth)acrylate, stearyl(meth)acrylate, cyclohexyl(meth)acrylate, isobornyl(meth)acrylate, dicyclopentenyl(meth)acrylate, benzil(meth)acrylate, methoxyethyl (meth)acrylate, ethoxyethyl(meth)acrylate, butoxymethyl (meth)acrylate, ethoxy-n-propyl(meth)acrylate, 2-hydroxyethyl(meth)acrylate, 2-hydroxypropyl(meth)acrylate, and 4-hydroxybutyl(meth)acrylate.

The vinyl compound monomer which can be copolymerized with the (meth)acrylic acid ester monomer may include a functional group-containing monomer having one or more kinds of functional groups, such as a carboxyl group, an epoxide group, an amide group, an amino group, a methylol group, a sulfonate group, a sulfamic acid group and a phosphoester group.

The monomer having a carboxyl group may include, for example, (meth)acrylic acid, crotonic acid, maleic acid, maleic anhydride, itaconic acid, fumaric acid, acrylamide-N-glycolic acid, and cinnamic acid. The monomer having a epoxide group may include, for example, allyl glycidyl ether and (meth) acrylic acid glycidyl ether. The monomer having an amide group may include, for example, (meth)acrylamide. The monomer having an amino group may include, for example, N,N-dimethylaminoethyl (meth)acrylate. The monomer having a methylol group may include, for example, N-methylolacrylamide.

(2-3) Photopolymerizable Compound

As the photopolymerizable compound, for example, trimethylolpropane triacrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexanediol diacrylate, polyethylene glycol diacrylate, cyanuric acid triethyl acrylate, and commercially available oligoester acrylate may be used.

As the photopolymerizable compound, an urethane acrylate oligomer may be used, in addition to the above-described acrylate-based compounds. The urethane acrylate oligomer is obtained in reaction of a terminal isocyanate-containing urethane prepolymer, which is obtained in reaction of a polyester- or polyether-type polyol compound with a polyvalent isocyanate compound, with hydroxy group-containing (meth)acrylate.

The polyvalent isocyanate compound may include, for example, 2,4-tolylene diisocyanate, 2,6-tolylene diisocyanate, 1,3-xylene diisocyanate, 1,4-xylene diisocyanate, diphenylmethane 4,4-diisocyanate, trimethylhexamethylene diisocyanate, hexamethylene diisocyanate, and isophorone diisocyanate. In addition, the hydroxy group-containing (meth)acrylate may include, for example, 2-hydroxyethyl (meth)acrylate, 2-hydroxypropyl(meth)acrylate, polyethylene glycol(meth)acrylate, pentaerythritol triacrylate, glycidol di(meth)acrylate, and dipentaerythritol monohydroxy pentaacrylate.

As the photopolymerizable compound, an urethane acrylate oligomer having four or more vinyl groups is preferable because it is possible to cure the adhesive sufficiently after the irradiation with UV light and so forth.

It is preferred that the compounding ratio of the photopolymerizable compound is equal to or higher than 5 parts by mass and equal to or less than 200 parts by mass with respect to 100 parts by mass of the (meth)acrylic acid ester copolymer. If the compounding ratio of the photopolymerizable compound is low, the peeling property of the adhesive sheet is deteriorated after the irradiation with UV light and so forth, and therefore pick-up failure of the semiconductor chips is likely to occur. On the other hand, if the compounding ratio of the photopolymerizable compound is high, the pick-up failure is likely to occur because the adhesive is scooped up during the dicing step and a little adhesive deposit is generated from the reaction residues, which causes contamination.

(2-4) Polyfunctional Isocyanate Curing Agent

The polyfunctional isocyanate curing agent is a compound having two or more isocyanate groups, and examples thereof may include, for example, an aromatic polyisocyanate, an aliphatic polyisocyanate, a cycloaliphatic polyisocyanate, and a dimer, a trimer and an adduct thereof.

The aromatic polyisocyanate may include, for example, 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanatotoluene, 1,3,5-triisocyanatobenzene, dianididine diisocyanate, 4,4'-diphenylether diisocyanate, 4,4',4"-triphenylmethane triisocyanate, ω,ω'-diisocyanato-1,3-dimethylbenzene, ω,ω'-diisocyanato-1,4-dimethylbenzene, ω,ω'-diisocyanato-1,4-diethylbenzene, 1,4-tetramethylxylylene diisocyanate, and 1,3-tetramethylxylylene diisocyanate.

The aliphatic polyisocyanate may include, for example, trimethylene diisocyanate, tetramethylene diisocyanate, hexamethylene diisocyanate, pentamethylene diisocyanate, 1,2-propylene diisocyanate, 2,3-butylene diisocyanate, 1,3- butylene diisocyanate, dodecamethylene diisocyanate, and 2,4,4-trimethylhexamethylene diisocyanate.

The cycloaliphatic polyisocyanate may include, for example, 3-isocyanatomethyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bis(cyclohexyl isocyanate), and 1,4-bis (isocyanatomethyl)cyclohexane.

The dimmer, the trimmer, and the adduct may include, for example, a dimmer of diphenylmethane diisocyanate, a trimmer of hexamethylene diisocyanate, and an adduct of trimethylolpropane and tolylene diisocyanate, and an adduct of trimethylolpropane and hexamethylene diisocyanate.

Among the above-described polyisocyanates, a polyisocyanate having three or more isocyanate groups is preferable, and particularly, a trimer of hexamethylene diisocyanate, an adduct of trimethylolpropane and tolylene diisocyanate, and an adduct of trimethylolpropane and hexamethylene diisocyanate are preferable.

The compounding ratio of the polyfunctional isocyanate curing agent may be preferably equal to or more than 0.5 parts by mass and equal to or less than 20 parts by mass, more preferably equal to or more than 1.0 parts by mass and equal to or less than 10 parts by mass, with respect to 100 parts by mass of the (meth)acrylic acid ester copolymer. When the compounding ratio of the polyfunctional isocyanate curing agent is equal to or more than 0.5 parts by mass, the adhesive strength is not excessive, and therefore it is possible to prevent pick-up failure from occurring. Meanwhile, when the compounding ratio of the polyfunctional isocyanate curing agent is equal to or less than 20 parts by mass, the adhesive strength is not reduced, and therefore it is possible to maintain the chip retention performance during the dicing step.

(2-5) Photoinitiator

The photoinitiator may include, for example, benzoin, benzoin alkyl ethers, acetophenones, anthraquinones, thioxanthones, ketals, benzophenones, and xanthones.

The benzoin may include, for example, benzoin methyl ether, benzoin ethyl ether and benzoin propyl ether. The acetophenones may include, for example, benzoin alkyl ethers, acetophenone, 2,2-dimethoxy-2-acetophenone, 2,2-diethoxy-2-acetophenone, and 1,1-dichloroacetophenone. The anthraquinones may include, for example, 2-methylanthraquinone, 2-ethylanthraquinone, 2-t-butylanthraquinone and 1-chloroanthraquinone. The thioxanthones may include, for example, 2,4-dimethylthioxanthone, 2-chlorothioxanthone and 2,4-diisopropylthioxanthone. The ketals may include, for example, acetophenone dimethyl ketal, benzyl dimethyl ketal, benzyldiphenylsulphide, tetramethylthiurammonosulphide, azobisisobutyronitrile, dibenzil, diacetyl, and β-chloranthraquinone.

It is preferred that the temperature of the photoinitiator is increased from 23 degrees Celsius to 500 degrees Celsius at a rate of temperature increase of 10 degrees Celsius/min, and the temperature at which the mass reduction rate of the photoinitiator is 10% is equal to or higher than 250 degree Celsius. In a case in which the adhesive sheet bonded to a wafer and so forth is heated at 60 to 150 degrees Celsius in the heating step described later, if the photoinitiator volatilizes or deteriorates, the adhesive layer is not sufficiently cured in a light irradiation step following the heating step, and therefore it is not possible to sufficiently reduce the adhesive strength. This causes pick-up failure in the pick-up step following the light irradiation step. Therefore, it is preferable to use a photoinitiator that has the above-described properties and is not likely to vaporize and deteriorate due to heating.

Examples of the photoinitiator having the temperature of equal to or higher than 250 degrees Celsius at which the mass reduction rate of the photoinitiator is 10% may include ethanone, 1-[9-ethyl-6-(2-methylbenzoyl)-9H-carbazole-3-yl]-, 1-(O-acetyl oxime) (product name: IRGACURE® OXE02, produced by Basf Japan Ltd.), 2,4,6-trimethylbenzoyl-diphenyl-phosphine oxide (product name: Lucirin® TPO, produced by Basf Japan Ltd.), 2-hydroxy-1-{4-[4-(2-hydroxy-2-methyl-propionyl)-benzyl]-phenyl}-2-methyl-propane-1-one (product name: IRGACURE®127, produced by Basf Japan Ltd.), 2-benzyl-2-dimethylamino-1-(4-morpholinophenyl)-butanone-1 (product name: IRGACURE®369, produced by Basf Japan Ltd.), 2-dimethylamino-2-(4-methyl-benzyl)-1-(4-morpholin-4-yl-phenyl)-butane-1-one (product name: IRGACURE®379, produced by Basf Japan Ltd.), and bis(2,4,6-trimethylbenzoyl)-phenylphosphine oxide (product name: IRGACURE®819, produced by Basf Japan Ltd.)

Among them, the ethanone, 1-[9-ethyl-6-(2-methylbenzoyl)-9H-carbazole-3-yl]-, 1-(O-acetyl oxime) (product name: IRGACURE® OXE02, produced by Basf Japan Ltd.), 2,4,6-trimethylbenzoyl-diphenyl-phosphine oxide (product name: Lucirin® TPO, produced by Basf Japan Ltd.), and 2-hydroxy-1-{4-[4-(2-hydroxy-2-methyl-propionyl)-benzyl]-phenyl}-2-methyl-propane-1-one (product name: Irgacure®127, produced by Basf Japan Ltd.) are preferable because the temperature at which the mass reduction rate is 10% is equal to or higher than 270 degrees Celsius.

It is preferred that the compounding ratio of the photoinitiator is equal to or higher than 0.1 parts by mass and equal to or less than 20 parts by mass with respect to 100 parts by mass of the (meth)acrylic acid ester copolymer. If the compounding ratio of the photoinitiator is too low, the peeling property of the adhesive sheet is deteriorated after the irradiation with UV light and so forth, and therefore pick-up failure of the semiconductor chips is likely to occur. On the other hand, if the compounding ratio of the photoinitiator is too high, the photoinitiator bleeds on the surface of the adhesive, which causes contamination.

One or two or more kinds of well-known photopolymerization promotors may be combined with the photoinitiator as needed. The photopolymerization promotor may include, for example, benzoic acid series and a tertiary amine. The tertiary amine may include, for example, trimethylamine, tetraethylpentaamine and dimethylaminoether.

The thickness of the adhesive layer is preferably equal to or more than 3 μm and equal to or less than 100 μm, more preferably equal to or more than 5 μm and equal to or less than 20 μm. If the adhesive layer is too thick, the adhesive strength becomes too high, and therefore the pick-up performance deteriorates. On the other hand, if the adhesive layer is too thin, the adhesive strength becomes too low, and therefore the chip retention performance in the dicing step deteriorates. As a result, peeling may occur between the ring frame and the sheet.

2. Method of Manufacturing Electronic Components

The method of manufacturing electronic components according to the present invention includes a step of heating the electronic components to which the above-described adhesive sheet is bonded at 60 to 150 degrees Celsius. Hereinafter, detailed steps of the manufacturing method will be described sequentially.

(1) Bonding Step

First, in the bonding step, the adhesive sheet is bonded to the semiconductor wafer (or substrate) and the ring frame. The wafer may be a conventional and general wafer such as a silicon wafer, a gallium nitride wafer, a silicon carbide wafer, and sapphire wafer.

(2) Heating Process

When the circuit formed on the wafer is tested, the wafer may be heated at about 60 to 150 degrees Celsius for about 15 minutes to 5 hours. In addition, the heating step may be performed in order to remove cutting water after the dicing step described next, and in this case, the wafer is heated at about 60 to 150 degrees Celsius for about 15 minutes to 5 hours in the same manner.

Even though being heated, the adhesive sheet according to the present invention is not significantly deformed because its base material has a low thermal shrinkage and a low linear expansion coefficient. In addition, the softening of the adhesive layer due to the softening of the tackifying resin does not occur, and therefore the adhesive layer is not excessively stick fast to the semiconductor wafer. Therefore, the method of manufacturing electronic components according to the present invention can prevent the testing time from being lengthened and semiconductor chips from being damaged due to the deformation of the adhesive sheet. Moreover, in the UV irradiation step and the pick-up step described later, it is possible to sufficiently reduce the adhesive strength of the adhesive layer by irradiation with UV light and so forth, and therefore to prevent the pick-up failure and the adhesive deposit.

(3) Dicing Step

In the dicing step, the silicon wafer is diced to produce semiconductor chips or semiconductor components. When the circuit is tested after the semiconductor chips or semiconductor components are produced, the above-described heating step is performed after the dicing step. The heating step may be performed in order to remove the cutting water after the dicing step.

(4) Light Irradiation Step

In the light irradiation step, the light curing adhesive layer is irradiated with active light such as UV light from the base material side. Examples of the light source of UV light may include a low-pressure mercury lamp, a high-pressure mercury lamp, an ultra-high pressure mercury lamp, a metal halide lamp, and a black light.

By the irradiation with light, the adhesive layer is turned into a three-dimensional network and cured, so that the adhesive strength of the adhesive layer is reduced. In this case, the adhesive sheet according to the present invention is not excessively stick fast to the wafer and so forth even though being heated as described above, and therefore it is possible to sufficiently reduce the adhesive strength by the irradiation with UV light and so forth.

(5) Pick-up Step

In the pick-up step, the semiconductor chips or semiconductor components are peeled off from the adhesive layer of the adhesive sheet. In this case, the adhesive strength of the adhesive sheet according to the present invention is sufficiently reduced by the irradiation with UV light and so forth, and therefore the chips or components can be easily peeled off from the adhesive layer. As a result, it is possible to achieve good pick-up performance and to prevent failure such as adhesive deposit. The semiconductor chips or components may be picked up by: transferring the chips or components onto another adhesive sheet; squeegeeing the adhesive sheet from the back side to peel the chips or components; and pushing up the chips or components with a needle pin. In addition, an expansion step may be provided before the pick-up step as needed. In the expansion step, the adhesive sheet is expanded to increase the distance between the semiconductor chips or components, so that they can be easily picked up.

After the pick-up step, the collected chips or components are mounted on the lead frame via die attach paste. After the chips or components are mounted, the die attach paste is heated to allow the chips or components thermally adhere to the lead frame. After that, the chips or components mounted on the lead frame are molded with resin.

EXAMPLES

Example 1

The light curing adhesive was prepared according to the combination shown in Table 1. The light curing adhesive was applied to a separator film made of polyethylene terephthalate so that the thickness of the adhesive layer was 10 μm after the adhesive layer is dried. This adhesive layer was laminated on the base material and aged at 40 degrees Celsius for 7 days to achieve an adhesive sheet. As the base material (K-1), polyethylenenaphthalate having a thickness of 100 μm, produced by Teijin DuPont Films Japan Limited, was used (product name: Teonex®Q51). Hereinafter, in Tables 1 and 2, the unit of each of the (meth) acrylic acid ester copolymer, the photopolymerizable compound, the polyfunctional isocyanate curing agent, the photoinitiator, the silicone-based graft copolymer and tackifying resin is parts by mass.

TABLE 1

| | | | EXAMPLES | | | | | | | | | | |
|---|---|---|---|---|---|---|---|---|---|---|---|---|---|
| | | | 1 | 2 | 3 | 4 | 5 | 6 | 7 | 8 | 9 | 10 | 11 |
| | BASE MATERIAL | | K-1 | K-2 | K-3 | K-4 | K-1 | K-2 | K-3 | K-4 | K-1 | K-1 | K-1 |
| | THERMAL SHRINKAGE/% | | 0.1 | 0.2 | 0.1 | 0.4 | 0.1 | 0.2 | 0.1 | 0.4 | 0.1 | 0.1 | 0.1 |
| | LINEAR EXPANSION COEFFICIENT/×10$^{-5}$/K | | 1.3 | 3.0 | 2.8 | 4.7 | 1.3 | 3.0 | 2.8 | 4.7 | 1.3 | 1.3 | 1.3 |
| UV CURING ADHESIVE | (METH)ACRYLIC ACID ESTER COPOLYMER | A-1 | 100 | 100 | 100 | 100 | 100 | — | 100 | 100 | 100 | 100 | 100 |
| | | A-2 | — | — | — | — | — | 100 | — | — | — | — | — |
| | PHOTOPOLYMERIZABLE COMPOUND | B-1 | 50 | 50 | 50 | 50 | 50 | 50 | — | 50 | 50 | 50 | 5 |
| | | B-2 | — | — | — | — | — | — | 50 | — | — | — | — |
| | POLYFUNCTIONAL ISOCYANATE CURING AGENT | C-1 | 3 | 3 | 3 | 3 | 3 | 3 | 3 | — | 3 | 3 | 3 |
| | | C-2 | — | — | — | — | — | — | — | 3 | — | — | — |
| | PHOTOINITIATOR | D-1 | 2 | 2 | 2 | 2 | — | — | — | — | — | — | 2 |
| | | D-2 | — | — | — | — | 2 | 2 | 2 | 2 | — | — | — |
| | | D-3 | — | — | — | — | — | — | — | — | 2 | — | — |
| | | D-4 | — | — | — | — | — | — | — | — | — | 2 | — |

TABLE 1-continued

|  |  |  | | | | | | | | | | | |
|---|---|---|---|---|---|---|---|---|---|---|---|---|---|
|  | SILICONE-BASED GRAFT COPOLYMER | E-1 | 1.5 | 1.5 | 1.5 | 1.5 | 1.5 | 1.5 | 1.5 | 1.5 | 1.5 | 1.5 | 1.5 |
|  | TACKIFYING RESIN | F-1 | — | — | — | — | — | — | — | — | — | — | — |
| EVALUATION | DEFORMATION OF WARMED SHEET | | ⊚ | ⊚ | ⊚ | ○ | ⊚ | ⊚ | ⊚ | ⊚ | ○ | ⊚ | ⊚ |
|  | CHIP RETENTION PERFORMANCE | | ⊚ | ⊚ | ⊚ | ⊚ | ⊚ | ⊚ | ⊚ | ⊚ | ⊚ | ⊚ | ⊚ |
|  | CHIP PICK-UP PERFORMANCE | | ⊚ | ⊚ | ⊚ | ⊚ | ⊚ | ⊚ | ⊚ | ⊚ | ⊚ | ⊚ | ○ |
|  | OVERALL EVALUATION | | ⊚ | ⊚ | ⊚ | ○ | ⊚ | ⊚ | ⊚ | ⊚ | ○ | ⊚ | ○ |

| | | | EXAMPLES | | | | | | | | | |
|---|---|---|---|---|---|---|---|---|---|---|---|---|
| | | | 12 | 13 | 14 | 15 | 16 | 17 | 18 | 19 | 20 | 21 |
| | BASE MATERIAL | | K-1 | K-1 | K-1 | K-1 | K-1 | K-1 | K-1 | K-1 | K-1 | K-1 |
| | THERMAL SHRINKAGE/% | | 0.1 | 0.1 | 0.1 | 0.1 | 0.1 | 0.1 | 0.1 | 0.1 | 0.1 | 0.1 |
| | LINEAR EXPANSION COEFFICIENT/×10$^{-5}$/K | | 1.3 | 1.3 | 1.3 | 1.3 | 1.3 | 1.3 | 1.3 | 1.3 | 1.3 | 1.3 |
| UV CURING ADHESIVE | (METH)ACRYLIC ACID ESTER COPOLYMER | A-1 | 100 | 100 | 100 | 100 | 100 | 100 | 100 | 100 | 100 | 100 |
| | | A-2 | — | — | — | — | — | — | — | — | — | — |
| | PHOTOPOLYMERIZABLE COMPOUND | B-1 | 150 | 200 | 50 | 50 | 50 | 50 | 50 | 50 | 50 | 50 |
| | | B-2 | — | — | — | — | — | — | — | — | — | — |
| | POLYFUNCTIONAL ISOCYANATE CURING AGENT | C-1 | 3 | 3 | 0.5 | 1 | 10 | 20 | 3 | 3 | 3 | 3 |
| | | C-2 | — | — | — | — | — | — | — | — | — | — |
| | PHOTOINITIATOR | D-1 | 2 | 2 | 2 | 2 | 2 | 2 | 0.1 | 1 | 10 | 20 |
| | | D-2 | — | — | — | — | — | — | — | — | — | — |
| | | D-3 | — | — | — | — | — | — | — | — | — | — |
| | | D-4 | — | — | — | — | — | — | — | — | — | — |
| | SILICONE-BASED GRAFT COPOLYMER | E-1 | 1.5 | 1.5 | 1.5 | 1.5 | 1.5 | 1.5 | 1.5 | 1.5 | 1.5 | 1.5 |
| | TACKIFYING RESIN | F-1 | — | — | — | — | — | — | — | — | — | — |
| EVALUATION | DEFORMATION OF WARMED SHEET | | ⊚ | ⊚ | ⊚ | ⊚ | ⊚ | ⊚ | ⊚ | ⊚ | ⊚ | ⊚ |
| | CHIP RETENTION PERFORMANCE | | ⊚ | ⊚ | ⊚ | ⊚ | ⊚ | ○ | ⊚ | ⊚ | ⊚ | ○ |
| | CHIP PICK-UP PERFORMANCE | | ⊚ | ○ | ○ | ⊚ | ⊚ | ⊚ | ○ | ⊚ | ⊚ | ⊚ |
| | OVERALL EVALUATION | | ⊚ | ○ | ○ | ⊚ | ⊚ | ○ | ○ | ⊚ | ⊚ | ○ |

<Base Material>

K-1: Polyethylenenaphthalate, Teonex®Q51 produced by Teijin DuPont Films Japan Limited, having a thickness of 100 μm; the thermal shrinkage at 150 degrees Celsius is 0.1%, and the linear expansion coefficient at 60 to 150 degrees Celsius is 1.3×10$^{-5}$/K.

K-2: A film of Japanese paper produced by Uniquetape Ltd., having a thickness of 70 μm; the thermal shrinkage at 150 degrees Celsius is 0.2%, and the linear expansion coefficient at 60 to 150 degrees Celsius is 3.0×10$^{-5}$/K.

K-3: Polyphenylene sulfide, TORELINA®3000 produced by Toray Industries, Inc., having a thickness of 100 μm; the thermal shrinkage at 150 degrees Celsius is 0.1%, and the linear expansion coefficient at 60 to 150 degrees Celsius is 2.6×10$^{-5}$/K.

K-4: Polyetheretherketone, SUMILITE®FS-1100C produced by Sumitomo Bakelite Co., Ltd., having a thickness of 100 μm; the thermal shrinkage at 150 degrees Celsius is 0.4%, and the linear expansion coefficient at 60 to 150 degrees Celsius is 4.7×10$^{-5}$/K.

<Light Curing Adhesive>
<(Meth)Acrylic Acid Ester Copolymer>

A-1: Acrylic rubber, Nipol®AR53L produced by ZEON CORPORATION; a copolymer of ethyl acrylate of 54%, butylacrylate of 19%, and methoxyethyl acrylate of 24% obtained by emulsion polymerization.

A-2: SK-Dyne®1496 produced by Soken Chemical & Engineering Co., Ltd.; a copolymer of 2-ethylhexyl acrylate of 96% and 2-hydroxyethyl acrylate of 4% obtained by solution polymerization.

<Photopolymerizable Compound>

B-1: UN-905 produced by Negami chemical industrial co., ltd; a compound obtained by reacting a trimer of isophorone diisocyanate with acrylate consisting primarily of dipentaerythritolpentaacrylate, and containing 15 vinyl groups.

B-2: A-TMPT produced by Shin Nakamura Chemical Co., Ltd.; trimethylolpropane triacrylate containing 3 vinyl groups.

<Polyfunctional Isocyanate Curing Agent>

C-1: CORONATE®L-45E produced by Nippon Polyurethane Industry Co., Ltd; an adduct of 2,4-tolylene diisocyanate and trimethylolpropane.

C-2: Trimethylene diisocyanate.

<Photoinitiator>

D-1: IRGACURE®127 produced by Basf Japan Ltd.; 2-hydroxy-1-{4-[4-(2-hydroxyl-2-methyl-propionyl)-benzyl]-phenyl}-2-methyl-propane-1-one; 275 degrees Celsius at which the mass reduction rate is 10%.

D-2: IRGACURE® OXE02 produced by Basf Japan Ltd.; ethanone, 1-[9-ethyl-6-(2-methylbenzoyl)-9H-carbazole-3-yl]-, 1-(O-acetyl oxime); 320 degrees Celsius at which the mass reduction rate is 10%.

D-3: Lucirin® TPO, produced by Basf Japan Ltd.; 2,4,6-trimethylbenzoyl-diphenylphosphine oxide; 270 degrees Celsius at which the mass reduction rate is 10%.

D-4: IRGACURE®651 produced by Basf Japan Ltd.; benzyl dimethyl ketal; 185 degrees Celsius at which the mass reduction rate is 10%.

<Silicone-based Graft Copolymer>

E-1: UTMM-LS2 produced by Soken Chemical & Engineering Co., Ltd.; a silicone-based graft copolymer obtained by polymerizing silicone-based oligomer units having (meth)acryloyl groups at the terminals of the silicone chains with acrylic vinyl units of such as methyl methacrylate.

<Tackifying Resin>

F-1: YS Polyster S145 produced by YASUHARA CHEMICAL.; terpene phenol resin having a softening point of 145 degrees Celsius.

The adhesive sheet of Example 1 was formed by UV curing adhesive containing: 100 parts by mass of a (meth) acrylic acid ester copolymer (A-1); 50 parts by mass of a photopolymerizable compound (B-1); 3 parts by mass of a polyfunctional isocyanate curing agent (C-1); 2 parts by mass of a photoinitiator (D-1); and 1.5 parts by mass of a silicone-based graft copolymer (E-1) listed in Table 1 as "silicone-based" copolymer. This adhesive sheet was bonded to the ring frame, and the silicon wafer having a diameter of 8 inches and a thickness of 0.1 mm and having a dummy circuit pattern formed thereon. The silicon wafer was placed on a hot plate such that the surface opposite to the surface to which the adhesive sheet is bonded contacts the hot plate, and was heated at 120 degrees Celsius for one hour. After that, the dicing step, the light irradiation step and the pick-up step were performed.

The conditions of the dicing step were as follows:

Dicing apparatus: DAD341 manufactured by DISCO Corporation;

Dicing blade: NBC-ZH2050-27HEEE manufactured by DISCO Corporation;

The shape of the dicing blade: outer diameter of 55.56 mm, cutting blade width of 35 μm, inner diameter of 19.05 mm;

The number of rotations: 40,000 rpm;

Feed rate: 50 mm/sec;

Dicing size: 10 mm×10 mm;

The depth of cutting into the adhesive sheet: 15 μm;

The temperature of cutting water: 25 degree Celsius; and

The amount of cutting water: 1.0 l/min.

The condition of the light irradiation was as follows:

Irradiation with UV light: exposure dose of 150 mJ/cm$^2$ by using a high-pressure mercury lamp.

The condition of the pick-up step was as follows:

A transfer adhesive sheet having an adhesive strength of 6.25 N/25 mm to the silicon wafer was bonded onto the diced wafer, and then the transfer adhesive sheet was peeled off, so that the chips were transferred.

The following evaluations were performed in the heating step.

(1) Deformation of the Adhesive Sheet

The sheet heated at 120 degrees Celsius for one hour was observed, and evaluated according to the following criteria.

E (Excellent): there was no "deformation" and "cockle" after the heating.

G (Good): there was slight "deformation" and "cockle" due to the heating.

B (Bad): there were "deformation" and "cockle" due to the heating.

The following evaluations were performed in the dicing step and the pick-up step.

(1) Chip Retention Performance

After the dicing step, the chip retention performance was evaluated based on the residual rate of the semiconductor chips that were retained on the adhesive sheet, according to the following criteria.

E (Excellent): 5% or less of chips peeled off;

G (Good): 5% or more and less than 10% of chips peeled off; and

B (Bad): 10% or more chips peeled off.

(2) Chip Pick-up Performance

In the pick-up step, the semiconductor chips were transferred by using the transfer adhesive sheet, and then, the chip pick-up performance was evaluated based on the percentage of the semiconductor chips that were successfully transferred, that is, successfully picked up, according to the following criteria.

E (Excellent): the success rate of the pick-up was 95% or more;

G (Good): the success rate of the pick-up was 80% or more and less than 95%; and B (Bad): the success rate of the pick-up was less than 80%.

The result of the evaluations is shown in Table 1. The adhesive sheet of Example 1 was not deformed after the heating step and evaluated as excellent in both the chip retention performance and the chip pick-up performance.

Examples 2 to 21

With Examples 2 to 21, the evaluated adhesive sheets were manufactured in the same manner as Example 1, except for the kinds of the base material, and the kinds or the presence or absence of the (meth)acrylic acid ester copolymer, the photopolymerizable compound, the polyfunctional isocyanate curing agent, the photoinitiator, and the silicone-based graft copolymer as shown in Table 1. The results were shown in Table 1.

Comparative Examples 1,2, and 4 to 9

With the comparative examples 1,2, and 4 to 9, the evaluated adhesive sheets were manufactured in the same manner as Example 1, except for the combinations shown in Table 2. The results are shown in Table 2.

K-5: Polyethylene terephthalate, Lumirror®S10 produced by Toray Industries, Inc., having a thickness of 100 μm; the thermal shrinkage at 150 degrees Celsius was 1.1%, and the linear expansion coefficient at 60 to 150 degrees Celsius was $6.5 \times 10^{-5}$/K.

K-6: A cyclic olefin copolymer, F film produced by GUNZE LIMITED, having a thickness of 100 μm; the thermal shrinkage at 150 degrees Celsius was 0.2%, and the linear expansion coefficient at 60 to 150 degrees Celsius was $6.5 \times 10^{-5}$/K.

Comparative Example 3

With the comparative example 3, the evaluated adhesive sheet was manufactured in the same manner as Example 1, except that the silicone-based graft copolymer was not added but the tackifying resin was added. The result is shown in Table 2.

TABLE 2

| | | | COMPARATIVE EXAMPLES | | | | | | | | |
|---|---|---|---|---|---|---|---|---|---|---|---|
| | | | 1 | 2 | 3 | 4 | 5 | 6 | 7 | 8 | 9 |
| | BASE MATERIAL | | K-5 | K-6 | K-1 | K-1 | K-1 | K-1 | K-1 | K-1 | K-1 |
| | THERMAL SHRINKAGE/% | | 1.1 | 0.2 | 0.1 | 0.1 | 0.1 | 0.1 | 0.1 | 0.1 | 0.1 |
| LINEAR EXPANSION COEFFICIENT/×10$^{-5}$/K | | | 6.5 | 6.5 | 1.3 | 1.3 | 1.3 | 1.3 | 1.3 | 1.3 | 1.3 |
| UV CURING ADHESIVE | (METH)ACRYLIC ACID ESTER COPOLYMER | A-1 | 100 | 100 | 100 | 100 | 100 | 100 | 100 | 100 | 100 |
| | | A-2 | — | — | — | — | — | — | — | — | — |
| | PHOTOPOLYMERIZABLE COMPOUND | B-1 | 50 | 50 | 50 | 1 | 250 | 50 | 50 | 50 | 50 |
| | | B-2 | — | — | — | — | — | — | — | — | — |
| | POLYFUNCTIONAL ISOCYANATE CURING AGENT | C-1 | 3 | 3 | 3 | 3 | 3 | 0.1 | 25 | 3 | 3 |
| | | C-2 | — | — | — | — | — | — | — | — | — |
| | PHOTOINITIATOR | D-1 | 2 | 2 | 2 | 2 | 2 | 2 | 2 | 0.01 | 25 |
| | | D-2 | — | — | — | — | — | — | — | — | — |
| | | D-3 | — | — | — | — | — | — | — | — | — |
| | | D-4 | — | — | — | — | — | — | — | — | — |
| | SILICONE-BASED GRAFT COPOLYMER | E-1 | 1.5 | 1.5 | — | 1.5 | 1.5 | 1.5 | 1.5 | — | — |
| | TACKIFYING RESIN | F-1 | — | — | 5 | — | — | — | — | 5 | 5 |
| EVALUATION | DEFORMATION OF WARMED SHEET | | X | X | ⊚ | ⊚ | ⊚ | ⊚ | ⊚ | ⊚ | ⊚ |
| | CHIP RETENTION PERFORMANCE | | — | — | ⊚ | ⊚ | ⊚ | ⊚ | X | ⊚ | ○ |
| | CHIP PICK-UP PERFORMANCE | | — | — | X | X | X | X | ○ | X | X |
| | OVERALL EVALUATION | | X | X | X | X | X | X | X | X | X |

The adhesive sheet of Examples 2 to 21 exhibited excellent chip retention performance and chip pick-up performance. On the other hand, the adhesive sheets of Comparative examples 1 and 2 were deformed after the heating step. Moreover, with the adhesive sheet of Comparative example 3, the chip pick-up performance was poor, and substantial adhesive deposit was observed.

The invention claimed is:

1. A heat-resistant adhesive sheet for semiconductor testing, used in a performance test white semiconductor chips are heated, the heat resistant adhesive sheet comprising:
a base material; and
an adhesive layer provided on the base material,
the base material having a thermal shrinkage of lower than 1% when being heated at 150 degrees Celsius for 30 minutes and a linear expansion coefficient of equal to or lower than 5.0×10$^{-5}$ at 60 to 150 degrees Celsius, and
the adhesive layer containing a (meth)acrylic acid ester copolymer, a photopolymerizable compound, a polyfunctional isocyanate curing agent, and photoinitiator, wherein:
the adhesive layer contains 5 to 200 parts by mass of the photopolymerizable compound, 0.5 to 20 parts by mass of the polyfunctional isocyanate curing agent, and 0.1 to 20 parts by mass of the photoinitiator, with respect to 100 parts by mass of the (meth)acrylic acid ester copolymer;
the adhesive layer is free of tackifying resin; and
the heat-resistant adhesive sheet is used in a method of manufacturing a semiconductor, the method comprising:
(a) a bonding step of bonding the adhesive sheet to the semiconductor chips;
(b) a placing step of placing the semiconductor chips to which the adhesive sheet is bonded on a stage while the adhesive sheet contacts the stage;
(c) a test step of testing performance of the semiconductor chips while the adhesive sheet on the stage is heated at 60 to 150 degrees Celsius; and
(d) a UV irradiation step of irradiating the adhesive sheet with ultraviolet light; and
(e) a pick-up step of picking up the semiconductor chips from the adhesive sheet.

2. The heat-resistant adhesive sheet according to claim 1, wherein the adhesive layer contains a silicone-based graft copolymer.

3. The heat-resistant adhesive sheet according to claim 1, wherein the polyfunctional isocyanate curing agent contains three or more isocyanate groups.

4. The heat-resistant adhesive sheet according to claim 1, wherein when a temperature of the photoinitiator is increased from 23 degrees Celsius to 500 degrees Celsius at a rate of 10 degrees Celsius/min, the photoinitiator has a mass reduction rate of 10% at a temperature equal to or higher than 250 degrees Celsius.

5. A heat-resistant adhesive sheet for semiconductor testing, used in a performance test while semiconductor chips are heated, the heat resistant adhesive sheet comprising:
a base material; and
an adhesive layer provided on the base material,
the base material having a thermal shrinkage of lower than 1% when being heated at 150 degrees Celsius for 30 minutes and a linear expansion coefficient of equal to or lower than 5.0×10$^{-5}$ at 60 to 150 degrees Celsius and
the adhesive layer containing a (meth)acrylic acid ester copolymer, a photopolymerizable compound, a polyfunctional isocyanate curing agent, and photoinitiator, wherein:
the adhesive layer contains 5 to 200 parts by mass of the photopolymerizable compound, 0.5 to 20 its by mass of the polyfunctional isocyanate curing agent, and 0.1 to 20 parts by mass of the photoinitiator, with respect to 100 parts by mass of the (meth)acrylic acid ester copolymer;
the adhesive layer is free of tackifying resin; and
the heat-resistant adhesive sheet is used for a method of manufacturing a semiconductor, the method comprising:
(a) a bonding step of bonding the adhesive sheet to a semiconductor wafer or a semiconductor substrate;
(b) a dicing step of dicing the semiconductor wafer to which the adhesive sheet is bonded or the semiconductor substrate to which the adhesive sheet is bonded into semiconductor chips;

(c) a placing step of placing the semiconductor chips to which the adhesive sheet is bonded on a stage while the adhesive sheet contacts the stage;

(d) a test step of testing performance of the semiconductor chips while the adhesive sheet on the stage is heated at 60 to 150 degrees Celsius;

(e) a UV irradiation step of irradiating the adhesive sheet with ultraviolet light; and (f) a pick-up step of picking up the semiconductor chips from the adhesive sheet.

6. The heat-resistant adhesive sheet according to claim 5, wherein the adhesive layer contains a silicone-based graft copolymer.

7. The heat-resistant adhesive sheet according to claim 5, wherein the polyfunctional isocyanate curing agent contains three or more isocyanate groups.

8. The heat-resistant adhesive sheet according to claim 5, wherein when a temperature of the photoinitiator is increased from 23 degrees Celsius to 500 degrees Celsius at a rate of 10 degrees Celsius/min, the photoinitiator has a mass reduction rate of 10% at a temperature equal to or higher than 250 degrees Celsius.

* * * * *